United States Patent
Jeong et al.

(12) 
(10) Patent No.: US 6,717,468 B1
(45) Date of Patent: Apr. 6, 2004

(54) DYNAMICALLY BIASED FULL-SWING OPERATION AMPLIFIER FOR AN ACTIVE MATRIX LIQUID CRYSTAL DISPLAY DRIVER

(75) Inventors: Deog-Kyoon Jeong, Seoul (KR); Weon Jun Choe, Seoul (KR)

(73) Assignee: Silicon Image, Inc., Sunnyvale, CA (US)

( * ) Notice: Subject to any disclaimer, the term of this patent is extended or adjusted under 35 U.S.C. 154(b) by 0 days.

(21) Appl. No.: 10/215,936

(22) Filed: Aug. 8, 2002

(51) Int. Cl.[7] .............................. H03F 3/45; H03F 1/02; H03F 1/14
(52) U.S. Cl. .............................. 330/253; 330/9; 330/51; 330/255
(58) Field of Search ................................ 330/253, 255, 330/9, 51

(56) References Cited

U.S. PATENT DOCUMENTS

| | | | | | |
|---|---|---|---|---|---|
| 3,889,202 A | * | 6/1975 | Suzuki | .......................... | 330/51 |
| 4,972,157 A | * | 11/1990 | Moyal | .......................... | 330/51 |
| 5,751,186 A | * | 5/1998 | Nakao | .......................... | 327/562 |
| 6,380,801 B1 | * | 4/2002 | McCartney | .................... | 330/9 |

* cited by examiner

*Primary Examiner*—Patricia Nguyen
(74) *Attorney, Agent, or Firm*—Dag Johansen; Stattler, Johansen & Adeli LLP

(57) ABSTRACT

A versatile amplifier circuit for driving a TFT LCD panel is disclosed. The amplifier circuit of the present comprises consists of a complementary input stage, biasing switches, and a rail-to-rail output stage. A signal-transfer switch determines which of two differential amplifiers in the input stage will drive the output stage of the amplifier. A biasing signal precharges a capacitor between the gates of output stage. The rail-to-rail output stage utilizes the precharged capacitor to maintain a voltage required to operate the output stage properly. A polarity signal is used to control the signal-transfer switch. The polarity signal specifies if a lower half of the input stage or an upper half of the input stage is used to drive the output stage of the amplifier circuit. A non-active transistor is kept turned-on above the threshold voltage for quick switching of the output driver. In one embodiment, a coupling capacitor is used between output stage transistors is for this purpose. This capacitor maintains the voltage necessary to keep the non-active transistor turned-on and flowing with a minimum current, and prevents the non-active transistor from being turned off. This simple scheme allows the amplifier circuit of the present invention to operate rapidly and in rail-to-rail range.

18 Claims, 6 Drawing Sheets

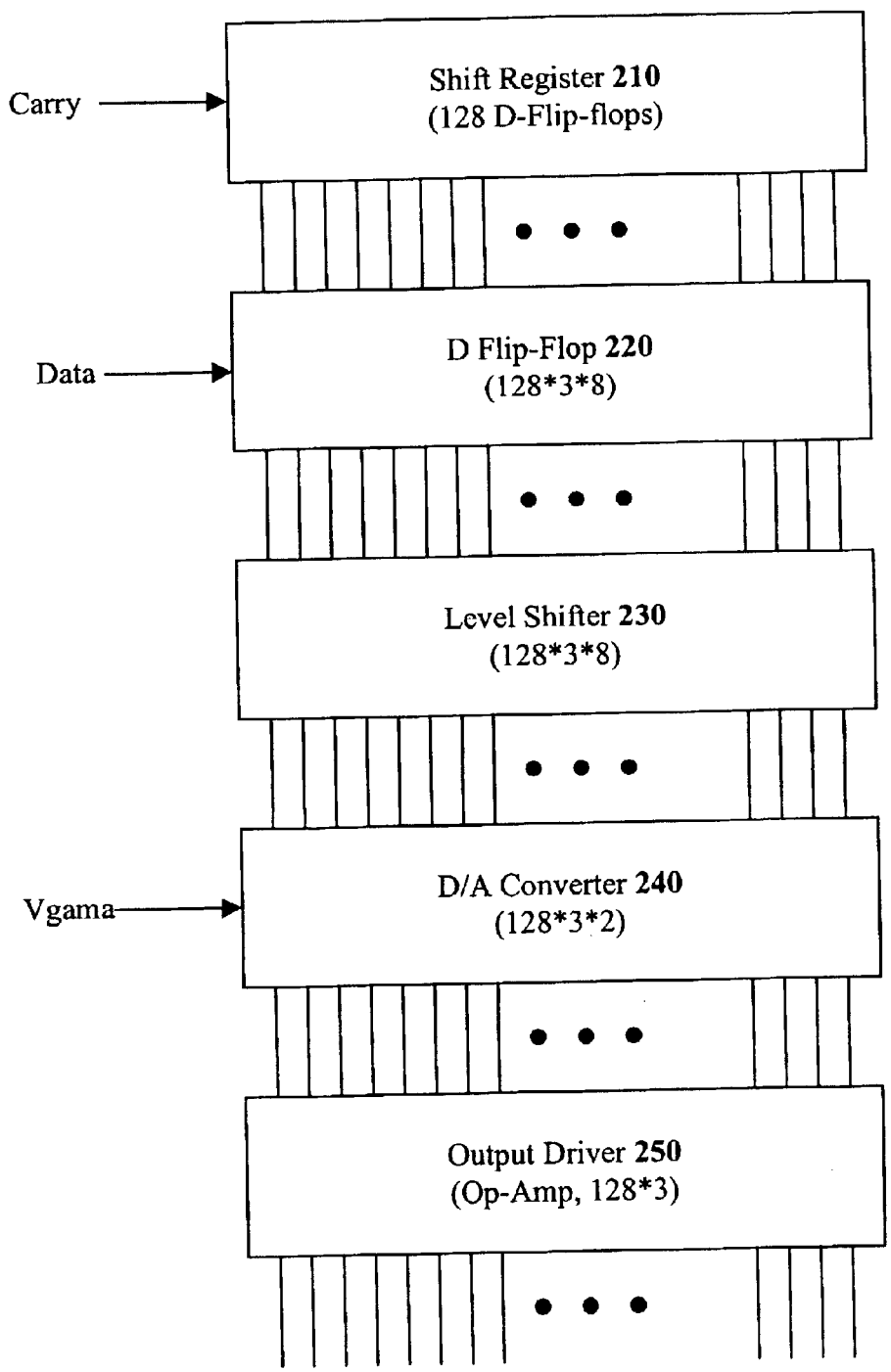
Figure 2 – Column-Driver

Odd frame    Even frame

Figure 3A

Full Frame Inversion

Figure 3B

Column Inversion

Figure 3C

Line Inversion

Figure 3D

Dot Inversion

Odd frame    Even frame

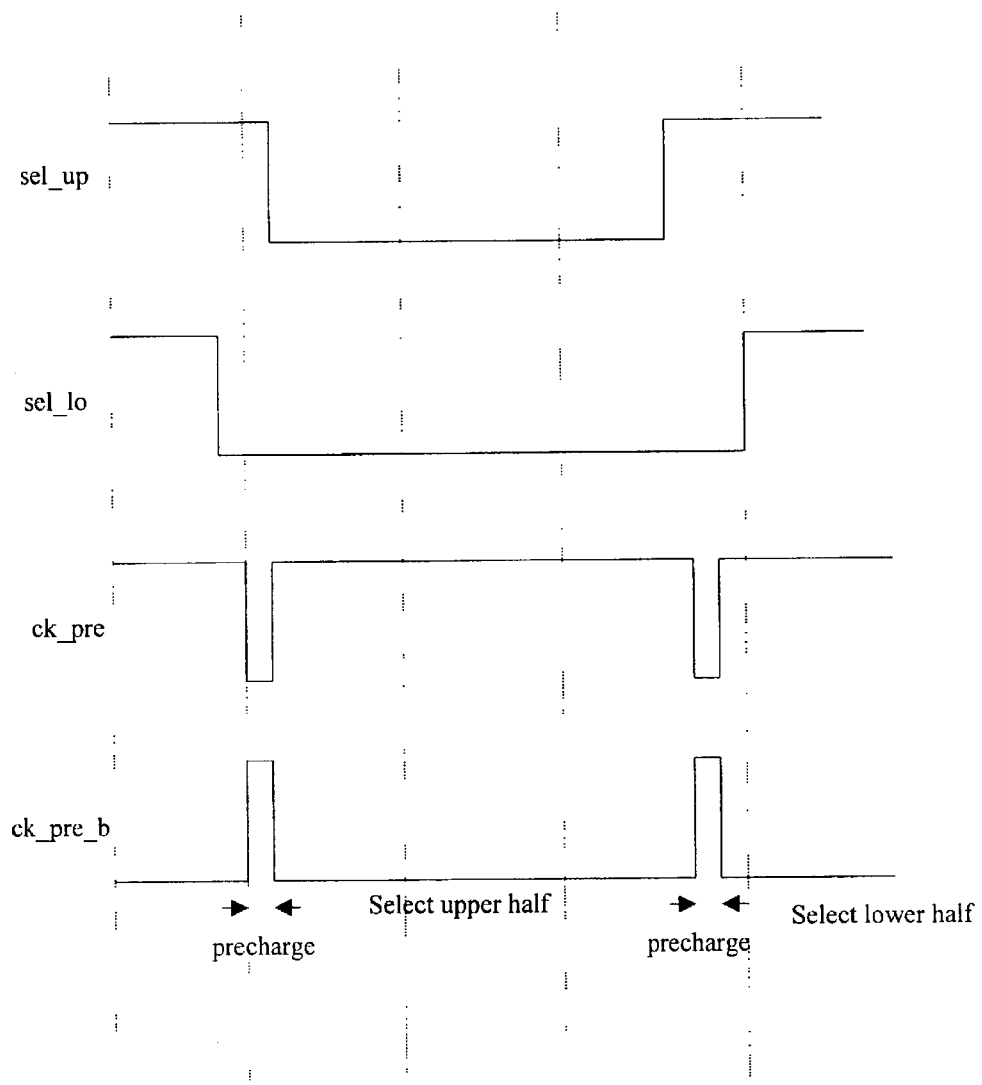
Figure 5 — Biasing-switch-set timing diagram

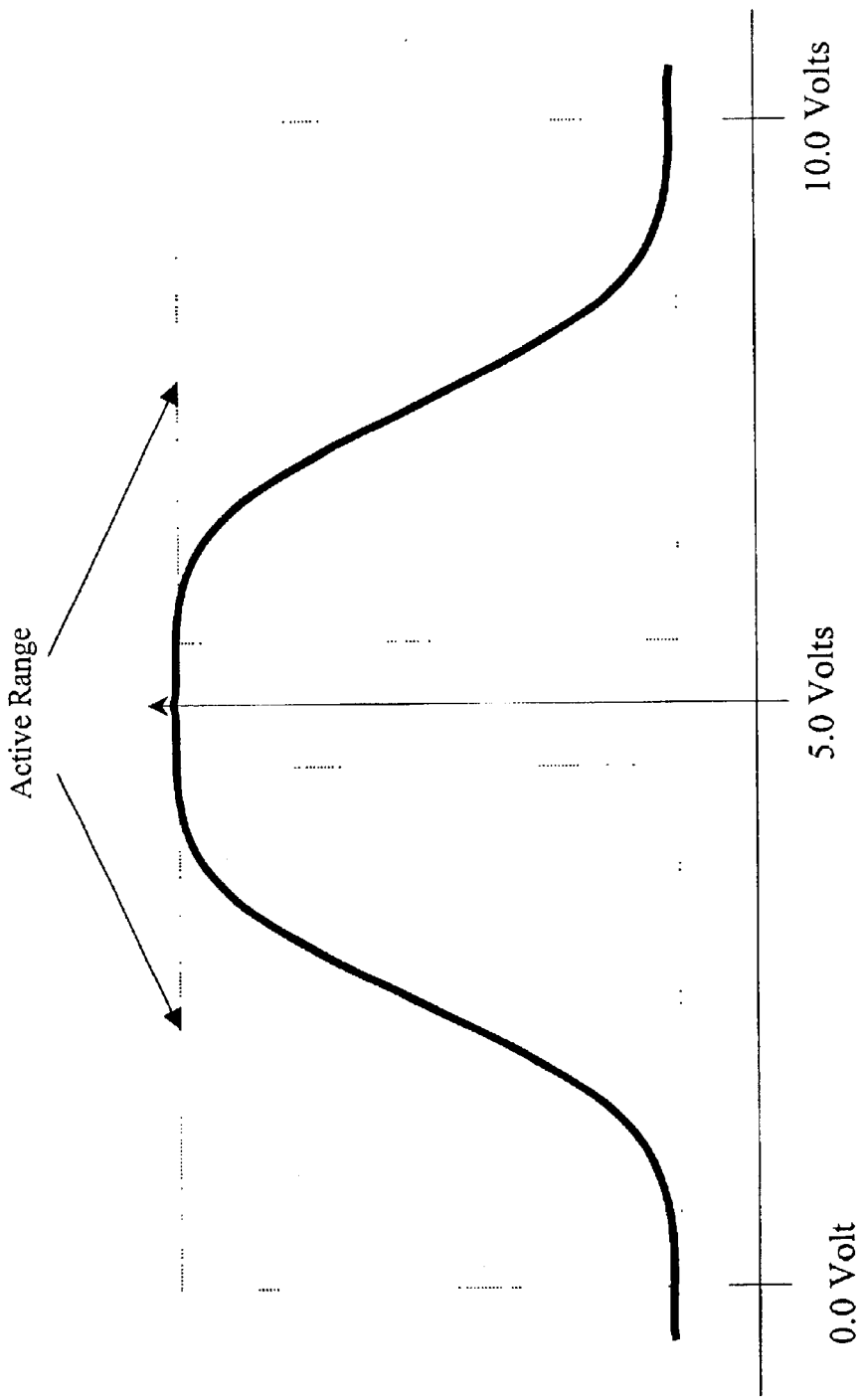
Figure 6 – Liquid Crystal Voltage v. Transmittance curve

US 6,717,468 B1

DYNAMICALLY BIASED FULL-SWING OPERATION AMPLIFIER FOR AN ACTIVE MATRIX LIQUID CRYSTAL DISPLAY DRIVER

FIELD OF THE INVENTION

The present invention relates to the field of display technologies. In particular the present invention discloses a signal amplifier that may be used in driving Liquid Crystal Display (LCD) panels.

BACKGROUND OF THE INVENTION

Liquid crystal display (LCD) panels generally operate by having a matrix of electrically controllable liquid crystals that are used to modulate reflected or emitted light. By turning on and off the liquid crystals of the matrix in a particular pattern, an image is rendered across liquid crystal matrix. Liquid crystal display panels are used in many different types of portable electronic devices such as digital cameras, notebook computers, and flat panel television systems.

The liquid crystals in a liquid crystal display panel will lose the capability of modulating light if the liquid crystals are not maintained properly. Specifically, the polarity of the voltage applied to a liquid crystal must be changed within specified time or else the desired chemical characteristics of the liquid crystal will change. Thus, in most liquid crystal systems, the polarity of the analog data is inverted between each successive frame. This liquid crystal maintenance technique is commonly referred to as "polarity-inversion."

A liquid crystal display panel generally operates with a 5.0 Volt differential. However, liquid crystals need twice that range in order to perform a required 'polarity inversion' that maintains the liquid crystals in the display panel. Thus, the amplifier for driving an LCD panel needs to drive a full 10.0 Volt range. Furthermore, an amplifier for a LCD panel must have a high slew rate in order to rapidly refresh the liquid crystal display panel. Thus, it would be desirable to have a wide voltage bandwidth and high slew-rate amplifier circuit for driving liquid crystal display panels.

SUMMARY OF THE INVENTION

The present invention introduces a versatile amplifier circuit of the can he used as a high voltage column driver circuit for a TFT LCD panel. The Amplifier circuit of the present comprises consists of a complementary input stage, biasing switches, and a rail-to-rail output stage. The complementary input stage can operate with a rail-to-rail input. A signal-transfer switch determines which of two differential amplifiers in the input stage will drive the output stage of the amplifier. A biasing signal precharges a capacitor between the gates of output stage. The rail-to-rail output stage utilizes the precharged capacitor to maintain a voltage required to operate the output stage properly.

A polarity signal is used to control the signal-transfer switch. The polarity signal specifies if the lower half of the input stage or the upper half of the input stage is used to drive the output stage of the amplifier circuit. A non-active transistor is kept turned-on above the threshold voltage for quick switching of the output driver. In one embodiment, a coupling capacitor is used between the PMOS transistor and NMOS transistor of the output stage for this purpose. This capacitor maintains the voltage necessary to keep the non-active transistor turned-on and flowing with a minimum current, and prevents the non-active transistor from being turned off. This simple scheme allows the amplifier circuit of the present invention to operate rapidly and in rail-to-rail range.

Other objects, features, and advantages of present invention will be apparent from the company drawings and from the following detailed description.

BRIEF DESCRIPTION OF THE DRAWINGS

The objects, features, and advantages of the present invention will be apparent to one skilled in the art, in view of the following detailed description in which:

FIG. 2 illustrates a block diagram of a column driver 1C for SXGA/UXGA TFT LCD panel. (A column driver drives 384 channels.)

FIG. 3A illustrates the frame inversion method of performing polarity inversion.

FIG. 3B illustrates the column inversion method of performing polarity inversion.

FIG. 3C illustrates the line (row) inversion method of performing polarity inversion.

FIG. 3D illustrates the dot inversion method of performing polarity inversion.

FIG. 5 illustrates a timing diagram of switch set control signal to precharge capacitor and select amplified signal of input stage.

FIG. 6 illustrates a voltage to Transmittance curve of Liquid Crystal.

DETAILED DESCRIPTION OF THE PREFERRED EMBODIMENT

A method and apparatus for implementing an amplifier circuit that may be used in a liquid crystal display system is disclosed. In the following description, for purposes of explanation, specific nomenclature is set forth to provide a thorough understanding of the present invention. However, it will be apparent to one skilled in the art that these specific details are not required in order to practice the present invention. For example, the amplifier circuit of the present invention has been described with reference to an implementation within a liquid crystal display panel. However, the same amplifier circuit can easily he applied in other types of electrical devices.

Liquid Crystal Display Overview

Figure 1:
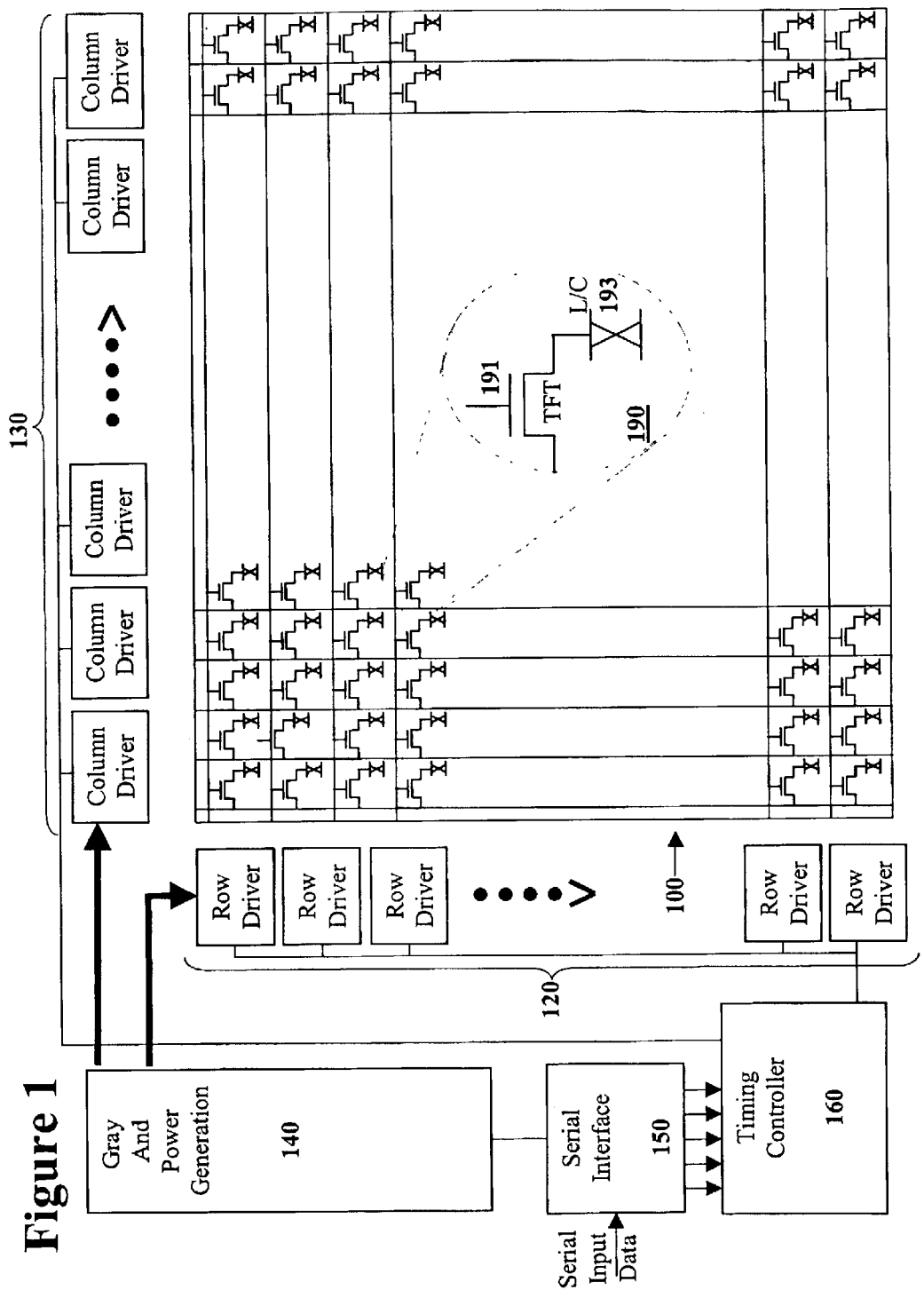
FIG. 1 illustrates a block diagram of a Thin Film Transistor (TFT) Liquid Crystal Display (LCD) module.

FIG. 1 illustrates a block diagram of a Thin Film Transistor (TFT) Liquid Crystal Display (LCD) panel system. A Thin Film Transistor (TFT) Liquid Crystal Display (LCD) panel system comprises an LCD panel 100, a set of row-driver circuits 120, a set of column-driver circuits 130, and a Printed Circuit Board (PCB) containing the other circuit elements.

In the LCD panel 100, there are many TFT switches, gate lines, data lines, and liquid crystals. Within the LCD panel 100 of FIG. 1, an enlarged pixel circuit 190 illustrates a detailed view of one pixel circuit that comprises a TFT switch 191 and a liquid crystal (L/C) 193. In an implementation of a Super Extended Graphics Adapter (SXGA) LCD panel that has pixel resolution of 1280×1024 pixels, there are U.S. Pat. No. 3,932,160 (1280×1024×3 colors) Thin Film Transistor (TFT) switches 191, 1024 horizontal row gate lines, 3840 (1280 columns×3 colors) column data lines, and U.S. Pat. No. 3,932,160 liquid crystal cells 193.

Typically, a TFT LCD panel operates as follows. A row-driver circuit activates one horizontal gate line by asserting a Gate-on signal. Column-driver circuits then drive analog data into the parallel source electrodes of the asserted gates for each of the columns to activate the TFT switches as necessary for one row of pixels of the image. The row-driver and the column-driver circuits then proceed to sequentially activate all of the horizontal rows of pixels in this manner. Within each activated horizontal row of pixels, a liquid crystal at each pixel modulates light (by reflecting oncoming light or transmitting backlight) using the applied voltage. Within each pixel circuit 190, each liquid crystal 193 can be modeled as a capacitor as illustrated in FIG. 1.

The graphic data and sync signal from graphic sources such as a graphics controller are usually sent to a TFT LCD system in a serial digital format as illustrated by serial interface 150 in FIG. 1. The use of a serial digital format minimizes the number of conductors required between the graphics controller and the display system. Furthermore, the use of a serial digital format also reduces signal noise during transmission. Referring to FIG. 1, the serial interface 150 for the display panel system receives the small swing serial data and converts the serial image data into parallel signals for activating a horizontal line (row) of pixels on a display matrix.

The serial interface 150 passes the parallel image data to a timing controller 160. Timing controller 160 generates control signals that control a set of row-driver circuits 120 and a set of column-driver circuits 130. The row-driver circuits 120 and the column-driver circuits 130 generate a Gate-On signal and a data signal to operate the TFT LCD. The display system may include other circuits, such as a gray and power generation circuit 140 that generates several voltage levels required to operate the TFT switches and liquid crystals in the LCD panel 100.

FIG. 2 illustrates a block diagram of one possible implementation of a column-driver circuit for a liquid crystal display system. The column driver circuit of FIG. 2 comprises a shift register 210, Data Flip-Flops (D-Flip-Flops) 220, a level shifter 230, Digital-to-Analog (D/A) converters 240, and output drivers 250. The shift register 210 has 128 D-Flip-Flops and shifts a carry signal clock by clock. The shifted carry enables the D-Flip-Flops 220 in the next stage to latch the digital graphic data that will be used to help build an image.

The level shifter 230 then converts 3.0 Volt digital graphic data from D-Flip-Flop stage 220 into 10.0 Volt digital data since the input of the digital-to-analog (D/A) converter 240 requires a 10.0 Volt voltage level. The 10.0 Volt digital data from the level shifter 230 drives the switches of the D/A converter 240, and the D/A converter 240 generates the corresponding analog voltage signals. Finally, when all the pixel data is ready to go out, the output drivers 250 drive the analog pixel data to an output load that comprises the controlled liquid crystal (L/C) and wire capacitance in the LCD panel. Thus, the output drivers 250 act as amplifiers for driving the pixel circuits 190 in the TFT LCD panel 100 of FIG. 1.

Liquid Crystal Display Maintenance

A liquid crystal may lose its ability to modulate light unless the liquid crystal is maintained properly. Specifically, the polarity of the applied voltage must be periodically changed within specified amount of time. This maintenance technique is referred to as "polarity-inversion." In many embodiments, the polarity of the applied analog voltage data is inverted between each successive frame refresh. This is referred to as "frame inversion" and is commonly used in TFT LCD systems.

There are several different techniques for performing polarity inversion with frame inversion. FIGS. 3A to 3D illustrate four different frame inversion techniques that may be used. FIG. 3A illustrates a "full frame inversion" technique wherein the polarity of all the liquid crystals are the same within each frame but are inverted between each successive frame refresh. FIG. 3B illustrates a "column inversion" technique wherein the polarity of adjacent columns in the frame have opposite polarity. The polarity of each column is then inverted between each successive frame. FIG. 3C illustrates a "line inversion" technique wherein the polarity of adjacent lines (rows) of a frame are opposite of one another and the polarity of each line (row) is inverted between each successive frame. Finally, FIG. 3D illustrates "dot inversion" technique wherein the liquid crystal switch polarity is arranged in a checkerboard pattern across the frame. Specifically, the polarity of vertically adjacent and horizontally adjacent pixels are opposite of one another and the polarity of each pixel is inverted between each successive frame.

Currently, the dot inversion technique is the most popular method of performing frame inversion to protect the LCD panel. The dot inversion technique generates less screen flicker and crosstalk when driving the TFT LCD display panel. However, the dot inversion method requires a high-voltage column driver circuit since the dot inversion technique needs twice the voltage range of the full frame technique or the line inversion technique.

A Dual-differential Amplifier Op-Amp

As set forth earlier with reference to FIGS. 1 and 2, a TFT LCD display system requires an output driver amplifier for driving the individual pixel circuits in the TFT LCD matrix and the wire capacitance inherent in the TFT LCD matrix. The driving capability of the output driver amplifier in a liquid crystal display is very important in order for the LCD display system to operate properly. The output driver amplifier will ideally have the ability to drive the output load linearly from 0.0 Volts to 10.0 Volts within a specified short period of time. For example, in one SXGA LCD panel embodiment, the time period for driving the load is less than 12 microseconds. The present invention introduces a novel amplifier circuit that satisfies the amplifier needs of a TFT LCD display system with a new and simple architecture.

The amplifier circuit of the present invention can be used as a high voltage column driver circuit that performs the dot inversion technique in driving a TFT LCD panel. Other very important Amplifier circuit characteristics are low power consumption and a good slew rate. Although a LCD) panel generally works in the 5.0 Volt range, a liquid crystal panel system needs twice that range in order to perform the aforementioned polarity inversion that maintains the chemical characteristic of the liquid crystal. Thus, the amplifier circuit for driving a LCD panel needs to drive the full 10.0V range between each frame refresh. To reduce power consumption, the design should ensure that the voltage drop between $V_{DD}$ (The power source voltage) and upper limit of active voltage range is minimized. The Amplifier circuit of the present invention achieves these goals.

The Amplifier circuit of the present comprises consists of a complementary input stage, biasing switches, and a railto-rail output stage. The complementary input stage can operate with a rail-to-rail input. The signal-transfer switch determines which of the two input stages will drive the output stage of the amplifier. The biasing signal precharges a capacitor ($C_{pre}$) between the gates of output stage. The rail-to-rail output stage utilizes the precharged capacitor to maintain a voltage required to operate the output stage properly.

A polarity (pol) signal is used to control the signal-transfer switch. The polarity signal originates from the LCD timing controller 160. The polarity signal specifies if the lower half of the input stage or the upper half of the input stage is used to drive the output stage of the amplifier circuit. A non-active transistor is kept turned-on above the threshold voltage for quick switching of the output driver. In one embodiment, a coupling capacitor is used between the PMOS transistor and NMOS transistor of the output stage for this purpose. This capacitor maintains the voltage necessary to keep the non-active transistor turned-on and flowing with a minimum current, and prevents the non-active transistor from being turned off. This simple scheme allows the amplifier circuit of the present invention to operate rapidly and in rail-to-rail range.

An Amplifier Implementation

Figure 4:
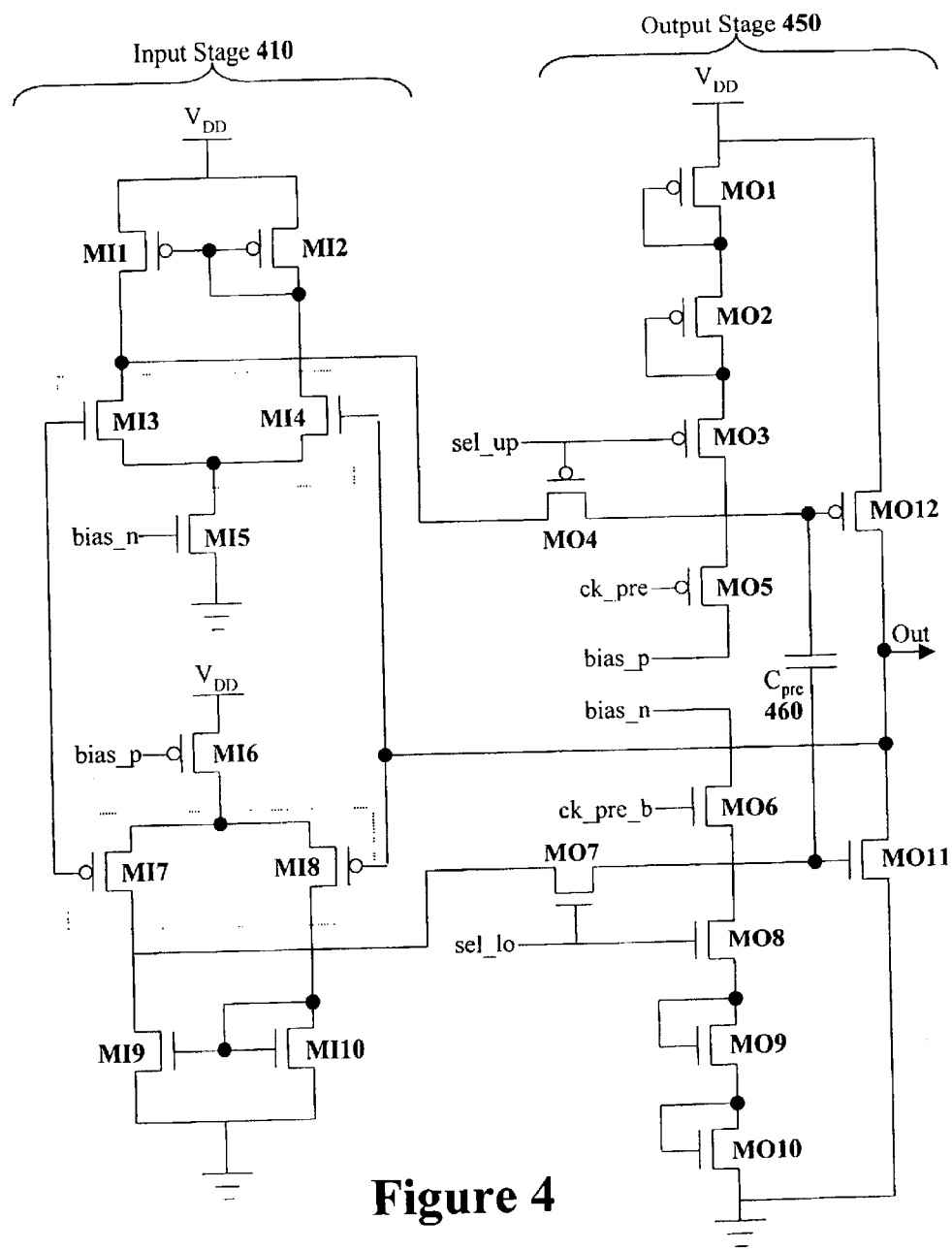
FIG. 4 illustrates a schematic circuit diagram of one embodiment of a differential amplifier in accordance with the present invention.

FIG. 4 illustrates an embodiment of one possible implementation of the proposed amplifier circuit. As illustrated in FIG. 4, the proposed amplifier circuit comprises two pairs of differential amplifiers in the input stage 410, a biasing-switch-set, and a rail-to-rail driver in the output stage 450.

NMOS input differential amplifier (transistors MI3–MI4) forms the upper half of the input stage 410 and PMOS input differential amplifier (transistors MI7–MI8) forms the lower half of the input stage 410. The upper half and lower half input stage differential pairs are actively loaded with the current mirrors formed by transistors MI1–MI2 and transistors MI9–MI10, respectively. The complementary input stage accepts a rail-to-rail range input signal.

The biasing-switch-set comprises upper half and lower half sets. The upper half switch consists of transistors MO4 and MO5. The lower half switch consists of transistors MO6 and MO7. Transistors MO4 and MO7 are signal-transfer switches between the input stage and the second stage. Transistors MO5 and MO6 are bias-transfer-switches that precharge the gate of the output transistors (MO11, MO12) when ck_pre or ck_pre_b are asserted. FIG. 5 illustrates a timing diagram for the ck_pre and ck_pre_b signals. The rail-to-rail output stage comprises one PMOS transistor (MO12), one NMOS transistor (MO11), and a coupling capacitor, $C_{pre}$, which is connected between the gates of transistor MO11 and transistor MO12.

FIG. 6 illustrates the operating voltage range of liquid. As illustrated in FIG. 6, the region around 5.0 Volts is not included in the active ranges. Thus, an amplifier for driving liquid crystal does not need to be linear throughout the entire range of 0.0 Volts to 10.0 Volts. Also, the amplifier needs to drive DC values only during a specified time period, typical value is 12 microseconds. For these reasons, the complementary input stage configuration illustrated in the embodiment of FIG. 4 with the biasing-switch-set is a suitable idea for this application. The amplifier implementation of the present invention is, thus, simple and operates well for this column driver circuit application.

Amplifier Operation

First of all, when ck_pre and ck_pre_b are asserted then the bias-transfer-switches (transistors MO5 and MO6) precharge the $C_{pre}$ capacitor 460. When ck_pre and ck_pre_b are asserted, signal-transfer-switches (transistors MO4 and MO7) are turned off. FIG. 6 illustrates an example timing relationship for certain signals in FIG. 4. The precharge time duration is only about 0.5 microseconds. That amount of time required for the precharging the $C_{pre}$ capacitor 460 is only a small fraction of the horizontal data time of 15.6 microseconds in the case of SXGA (1280×1024 pixels) LCD panel that is refreshed at 60 Hz.

After the bias-transfer-switches (transistors MO5 and MO6) precharge the $C_{pre}$ capacitor 460, one of the two outputs of the differential amplifiers in the input stage 410 is selected by the signal-transfer-switches to drive the output stage transistors. For example, if the upper-half differential amplifier is enabled by asserting the sel_up signal, then the sel_up signal enables the upper signal-transfer-switch (closes the switch), transistor MO4, and disables the lower signal-transfer-switch (opens the switch), transistor MO7, to transfer only upper-half amplified signal to output stage. At this time, both bias-transfer-switches, transistors MO5 and MO6, are open. In one embodiment, the polarity (pol) signal is used to generate the sel_up and sel_lo signals illustrated in FIG. 4.

The precharge capacitor ($C_{pre}$) 460 acts as a constant voltage source between the gates of transistors MO12 and MO11 of the rail-to-rail output stage 460. The precharge capacitor ($C_{pre}$) 460 maintains a determined voltage gap between the two inputs of the output stage. Furthermore, the precharge capacitor ($C_{pre}$) 460 allows the non-selected transistor of the output stage 450 to drive a little current. Thus, the nonactive transistor of the output stage 450 is not completely turned off but instead drives only a small amount of current. The amplifier circuit of FIG. 4 can drive a liquid crystal rapidly enough to charge it within the required charging time without the turn-on delay of the non-active transistor of output stage 460. Specifically, the amplifier circuit of the present invention has a slew rate fast enough to drive an SXGA resolution TFT LCD panel at a refresh rate of 60 Hz (a slew rate of less than 12 microseconds).

The foregoing has described an amplifier circuit that may be used to drive liquid crystal pixels in an LCD panel. It is contemplated that changes and modifications may be made by one of ordinary skill in the art, to the materials and arrangements of elements of the present invention without departing from the scope of the invention.

We claim:

1. A circuit for amplifying an input signal, said circuit for amplifying said input signal comprising:

an amplifier output stage;

a first amplifier input stage coupled to said amplifier output stage;

a second amplifier input stage coupled to said amplifier output stage;

a signal transfer switch to select if said first amplifier input stage or said second amplifier input stage drives said amplifier output stage;

a precharge capacitor in said amplifier output stage; and a bias transfer switch for charging said precharge capacitor before said signal transfer switch is activated.

2. The circuit for amplifying as claimed in claim 1 wherein said bias transfer switch comprises a pair of transistors.

3. The circuit for amplifying as claimed in claim 1 wherein said first amplifier input stage comprises an N-pair differential amplifier and said second amplifier input stage comprises a P-pair differential amplifier.

4. The circuit for amplifying as claimed in claim 3 wherein said first amplifier input stage further comprises an N-MOS current source and a first current mirror as an active load and said second amplifier input stage further comprises a P-MOS current source and second current mirror as an active load.

5. The circuit for amplifying as claimed in claim 1 wherein said amplifier output stage comprises a rail-to-rail output stage to drive an output load with a rail-to-rail output range.

6. The circuit for amplifying as claimed in claim 1 wherein said precharge capacitor allows a non selected output transistor in said output stage to drive a small amount of current.

7. A circuit for amplifying an input signal, said circuit for amplifying said input signal comprising:
   an amplifier output stage, said amplifier output stage comprising a first output transistor and a second output transistor;
   a precharge capacitor, said precharge capacitor coupled to a gate of said first output transistor and a gate of said second output transistor; and
   a first switch to charge said precharge capacitor.

8. The circuit for amplifying as claimed in claim 7 further comprising:
   a first amplifier input stage coupled to said amplifier output stage;
   a second amplifier input stage coupled to said amplifier output stage; and
   a second switch to select if said first amplifier input stage or said second amplifier input stage drives said amplifier output stage.

9. The circuit as claimed in claim 8 wherein said second switch is off when said first switch is on to precharge said precharge capacitor.

10. The circuit as claimed in claim 8 wherein said second switch is activated only after said precharge capacitor is charged.

11. The circuit as claimed in claim 7 wherein a precharge period to precharge said precharge capacitor is approximately 0.5 microseconds.

12. The circuit for amplifying as claimed in claim 7 wherein said amplifier output stage comprises a rail-to-rail output stage to drive an output load with a rail-to-rail output range.

13. A circuit for amplifying an input signal, said circuit for amplifying said input signal comprising:
   an amplifier output stage, said amplifier output stage comprising a first output transistor with a first input of said output stage and a second output transistor with a second input of said output stage, said first output transistor being active if said first input is used, said second output transistor being active if said second input is used; and
   a precharge capacitor, said precharge capacitor coupled said first input and said second input;
   a first switch for precharging said precharge capacitor, wherein voltage from said precharge capacitor allows a non-active output transistor to drive a small amount of current.

14. The circuit for amplifying as claimed in claim 13 further comprising:
   a first amplifier input stage coupled to said first input of said amplifier output stage;
   a second amplifier input stage coupled to said second input of said amplifier output stage; and
   a second switch to select if said first amplifier input stage or said second amplifier input stage drives said amplifier output stage.

15. The circuit as claimed in claim 14 wherein said second switch is off when said first switch is on to precharge said precharge capacitor.

16. The circuit as claimed in claim 14 wherein said second switch is activated only after said precharge capacitor is charged.

17. The circuit as claimed in claim 14 wherein said first switch for precharging said precharge capacitor is activated before activating said first output stage or said second output stage.

18. The circuit as claimed in claim 14 wherein said first switch for precharging said precharge capacitor is activated before activating said first output stage or said second output stage.

* * * * *